United States Patent [19]
Murayama et al.

[11] Patent Number: 5,708,277
[45] Date of Patent: Jan. 13, 1998

[54] OPTICALLY COUPLED DEVICE WITH HIGH CURRENT PROTECTION

[75] Inventors: Atsushi Murayama, Nabari; Masatosi Kotake, Tenri; Kazuya Uekawa, Gojo, all of Japan

[73] Assignee: Sharp Kabushiki Kaisha, Osaka, Japan

[21] Appl. No.: 569,991

[22] Filed: Dec. 8, 1995

[30] Foreign Application Priority Data

Dec. 28, 1994 [JP] Japan ............... 6-328771

[51] Int. Cl.⁶ .................................................. G02B 27/00
[52] U.S. Cl. .................................. 250/551; 327/514
[58] Field of Search ...................... 250/551; 327/514, 327/512, 379, 313

[56] References Cited

U.S. PATENT DOCUMENTS

| | | | |
|---|---|---|---|
| 3,996,475 | 12/1976 | Rodriguez | 250/551 |
| 4,121,122 | 10/1978 | Pokrandt | 307/362 |
| 4,143,287 | 3/1979 | Biggs | 307/311 |
| 4,535,251 | 8/1985 | Herman et al. | 250/551 |
| 5,216,303 | 6/1993 | Lu | 307/632 |
| 5,418,381 | 5/1995 | Aizawa | 327/514 |
| 5,559,340 | 9/1996 | Nakamura et al. | 327/514 |

FOREIGN PATENT DOCUMENTS 57-192729   12/1982   Japan.

*Primary Examiner*—Stephone Allen
*Assistant Examiner*—Alan L. Giles

[57] ABSTRACT

An optically coupled device is composed of input and output sides. The input side includes a light-emitting element while the output side includes: an element for driving; a light-receiving element for receiving light from the light-emitting element to turn on the element for driving; and a resistance element having a positive or negative temperature-coefficient and connected in series with the light-receiving element. By the above configuration, the optically coupled device by itself is constructed to prevent rush-current from occurring and to the device itself from being excessively heated due to excessive current.

12 Claims, 14 Drawing Sheets

POWER-SOURCE VOLTAGE AC100V (100V/div)

CURRENT (0.5A/div)

POWER-SOURCE VOLTAGE AC100V (100V/div)

CURRENT (0.5A/div)

RESISTANCE-TEMPERATURE CHARACTERISTICS OF A NEGATIVE CHARACTERISTIC THERMISTOR

RESISTANCE-TEMPERATURE CHARACTERISTICS OF A POSITIVE CHARACTERISTIC THERMISTOR

OPTICALLY COUPLED DEVICE WITH HIGH CURRENT PROTECTION

BACKGROUND OF THE INVENTION

(1) Field of the Invention

The present invention relates to an optically coupled device such as solid-state relays, photocouplers and the like, and particularly relates to an optically coupled device having excessive-heat preventing function and/or rush-current preventing function.

(2) Description of the Prior Art

FIG. 1 is a configurational view showing a conventional solid-state relay (to be referred to hereinbelow as an SSR). The SSR has a light-emitting diode 10 on its input side while the output side of the SSR includes a driving triac 11 and a photo-triac 12 which receives light from the light-emitting diode 10 and ignites the driving triac 11. All these elements are provided in a package PK.

FIG. 2 is a configurational view showing a conventional photocoupler. The photocoupler has a light-emitting diode 20 on its input side and a phototransistor 21 on its output side which operates as receiving light from the light-emitting diode 20. All these elements are provided in a package PK.

FIG. 3 is a block diagram showing a rush-current preventing circuit using an SSR. In order to prevent generation of rush-current, this circuit includes the following circuitries and effect the following procedures: That is, a zero-volt detecting circuit 1, as receiving an input signal, detects zero-volt level of an ac line. Then, a conduction-angle delaying circuit 2 at the next step, delays the conduction-angle of the input signal. The input signal with thus the conduction-angle delayed is supplied to a transistor 3 to activate the SSR. This is how the circuit prevents rush-current from occurring.

FIG. 4A is an example of measurement of a rush-current when it is generated in a blower motor, whereas FIG. 4B is an example of measurement of the rush-current decreased. From these charts, it is understood that a rush-current (2.1 A at peak) generated when the input signal is started at a conduction angle of 0° can be reduced to 0.6 A at peak when the signal is started at a conduction angle of 90°.

FIG. 5A is an example of measurement of a rush-current in a lamp load, whereas FIG. 5B is an example of measurement of the rush-current decreased. From these charts, it is understood that a rush-current (1.8 A at peak) generated when the input signal is started at a conduction angle of 90° can be reduced to 1.2 A at peak when the signal is started at a conduction angle of 315°.

The conventional optically coupled device, since it has no protecting functions against generation of an excessive current flowing on the output side or against an extreme rise of temperature in its surroundings, requires peripheral circuitries, as shown in FIG. 3, which serve to protect the device from the above-mentioned phenomena. This necessity of extra circuitries has been an obstacle to reduce the parts on the assembly board or save the space on the board.

SUMMARY OF THE INVENTION

It is therefore an object of the present invention to provide an optically coupled device which by itself is able to prevent rush current from occurring and has a function of protecting the device itself from being excessively heated due to excessive current, without needing any complicated peripheral elements.

The present invention has been achieved to attain the above object and the gist is as follows:

An optically coupled device in accordance with a first feature of the invention, comprises: input and output sides, the input side comprising: a light-emitting element, and the output side comprising: an element for driving; a light-receiving element for receiving light from the light-emitting element to turn on the element for driving; and a resistance element having a positive or negative temperature-coefficient and connected in series with the light-receiving element.

An optically coupled device in accordance with a second feature of the invention, comprises: input and output sides, the input side comprising: a light-emitting element; and a resistance element having a positive temperature-coefficient and connected in series with the light-emitting element, and the output side comprising: an element for driving; and a light-receiving element for receiving light from the light-emitting element to turn on the element for driving.

An optically coupled device in accordance with a third feature of the invention, comprises: input and output sides, the input side comprising: a light-emitting element; and a resistance element having a negative temperature-coefficient and connected in parallel with the light-emitting element, and the output side comprising: an element for driving; and a light-receiving element for receiving light from the light-emitting element to turn on the element for driving.

An optically coupled device in accordance with a fourth feature of the invention, comprises: input and output sides, the input side comprising: a light-emitting element; and a plurality of silicon diodes connected in parallel with the light-emitting element, and the output side comprising: an element for driving; and a light-receiving element which receives light from the light-emitting element and ignite the element for driving.

An optically coupled device in accordance with a fifth feature of the invention, comprises: input and output sides, the input side comprising: a light-emitting element, and the output side comprising: an element for driving; a light-receiving element for receiving light from the light-emitting element to turn on the element for driving; a thyristor connected in series with the light-receiving element; and a resistance element having a negative temperature-coefficient for turning on the thyristor.

As the present invention is thus constructed, the following effects can be expected:

First, in accordance with the first feature of the invention, in the case where the resistance element has a negative temperature-coefficient; if a rush current flows on the output side of the optically coupled device from a load such as a motor, lamp or the like, driven by the element for driving (such as a triac), the conduction-angle at which the element for driving is turned on is delayed, whereby the rush current is decreased. In contrast, in the case where the resistance element has a positive temperature-coefficient; if the device is heated, the resistance value of the resistance element increases, so that the conduction-angle of the element for driving is delayed. As a result, the effective current flowing through the element for driving lowers in its magnitudes, to thereby prevent excessive heating. Thereafter, when the anomaly state is canceled to recover the normal state, the package temperature lowers so that the operation of the device returns to the stationary state.

In accordance with the second feature of the invention, since the resistance value of the resistance element increases when the device is heated, current flowing through the lightl-emitting element connected in series decreases, so that the emission of light stops. Hence, the element for driving is turned off to thereby prevent the package temperature from excessively rising.

In accordance with the third feature of the invention, since the resistance value of the resistance element decreases when the device is heated, current flowing through the light-emitting element connected in parallel decreases, so that the emission of light stops. Hence, the element for driving is turned off to thereby prevent the package temperature from excessively rising.

In accordance with the fourth feature of the invention, since the sum of the forward voltages across the silicon diodes becomes smaller than the forward voltage across the light-emitting device when the device is heated, current flowing through the light-emitting element decreases, so that the emission of light stops. Hence, the element for driving is turned off to thereby prevent the package temperature from excessively rising.

In accordance with the fifth feature of the invention, as the resistance value of the resistance element decreases when the device is heated, the thyristor is turned on. This causes the element for driving to be turned off, whereby anomaly operations during high-temperature states are prevented. Besides, once the thyristor is turned on, it will not return to its original state unless the power supply is reset. Accordingly, the device also has a function of shutting down the excessive heating.

DESCRIPTION OF THE PREFERRED EMBODIMENTS

Figure 1:
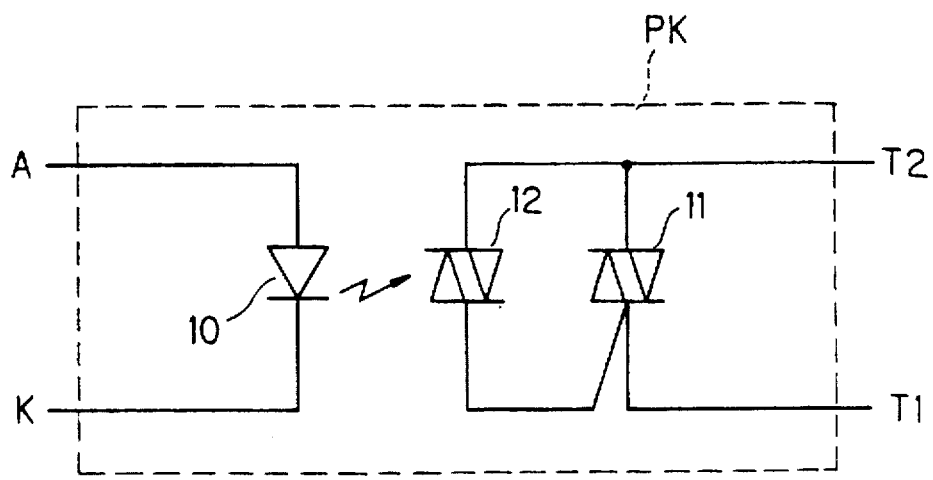
FIG. 1 is a configurational view showing a conventional solid-state relay.
Figure 2:
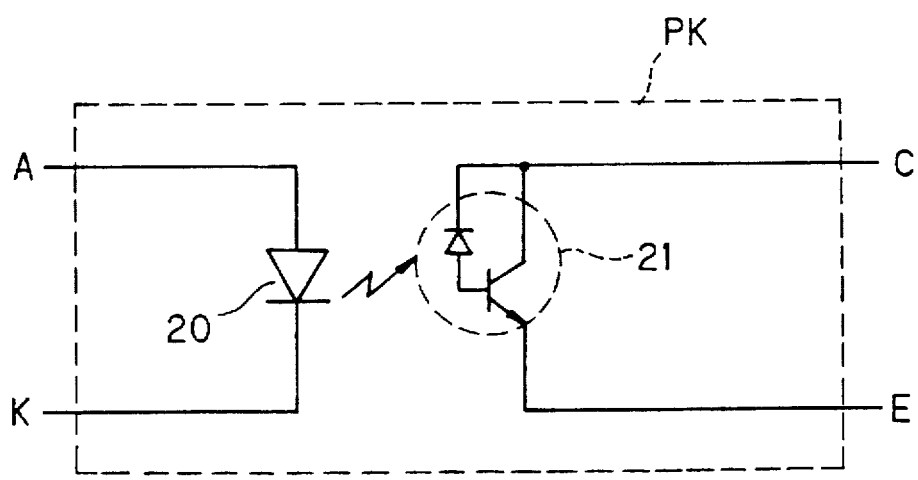
FIG. 2 is a configurational view showing a conventional photocoupler.
Figure 3:
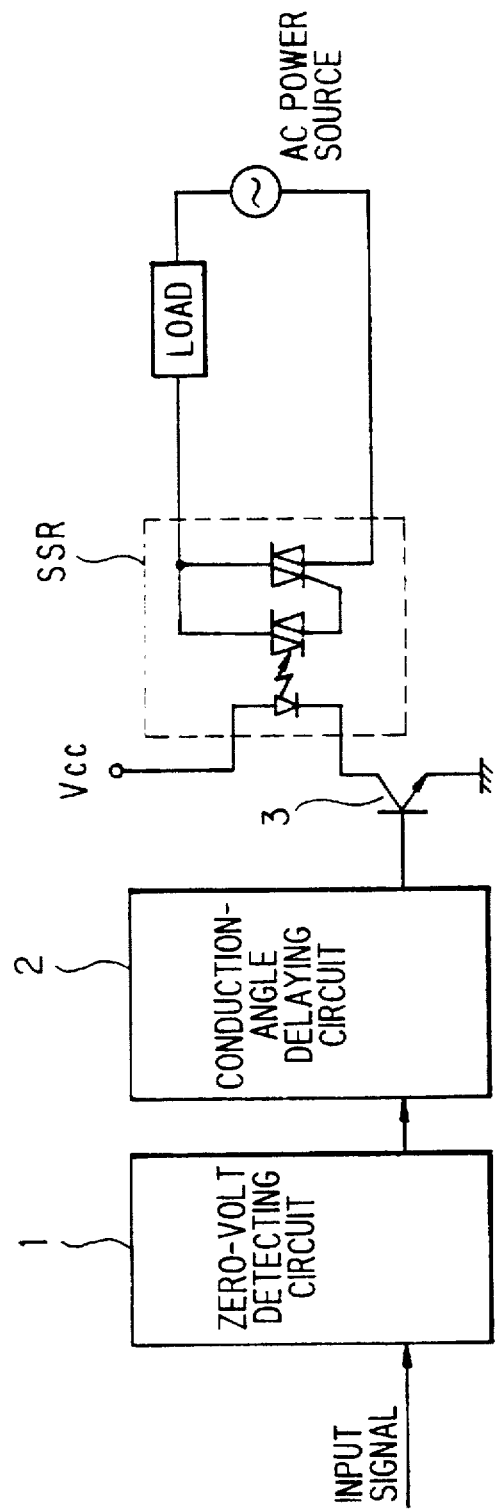
FIG. 3 is a conventional rush-current preventing circuit using a solid-state relay.
Figure 4A:
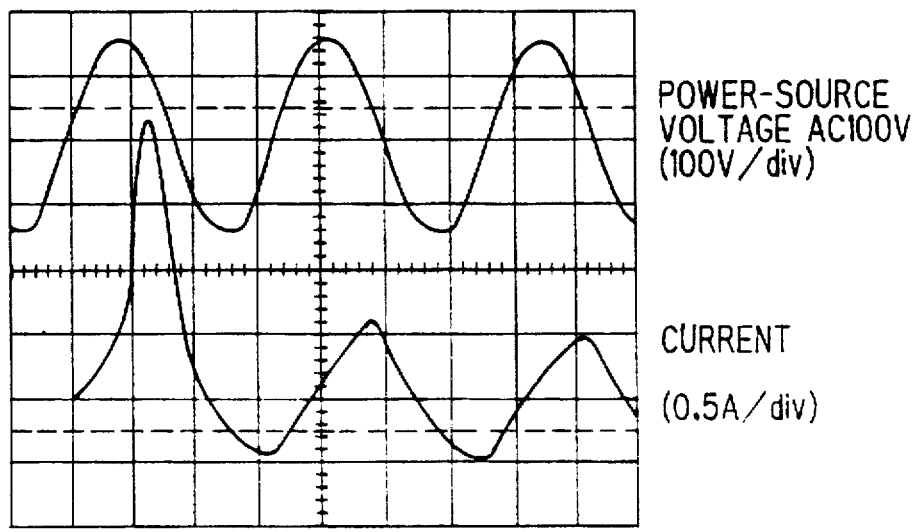
FIG. 4A is a chart showing an example of measurement where a rush-current is generated in a blower motor.
Figure 4B:
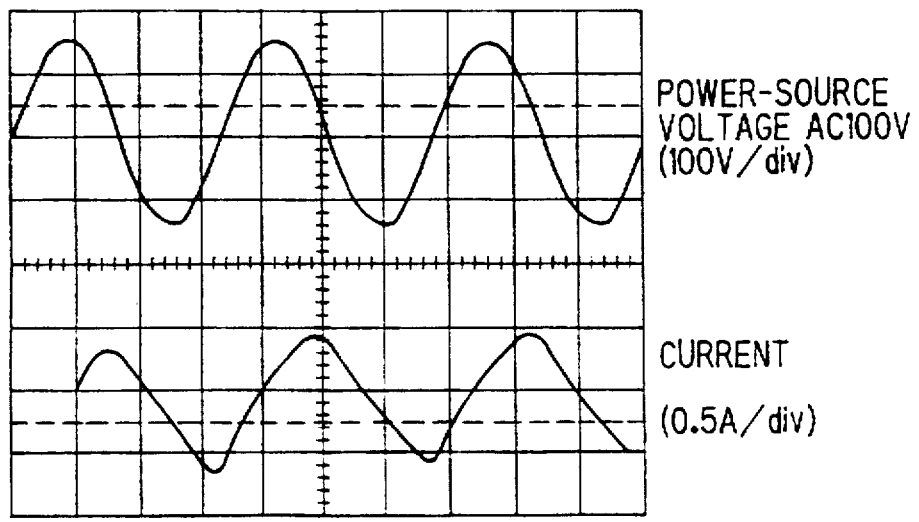
FIG. 4B is a chart showing an example of measurement where the rush-current is decreased.
Figure 5A:
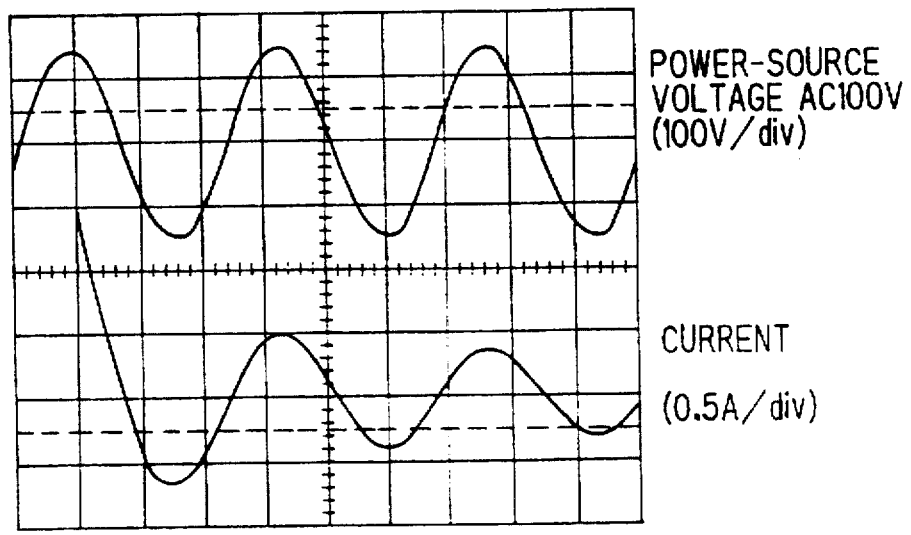
FIG. 5A is a chart showing an example of measurement where a rush-current is generated in a lamp load.
Figure 5B:
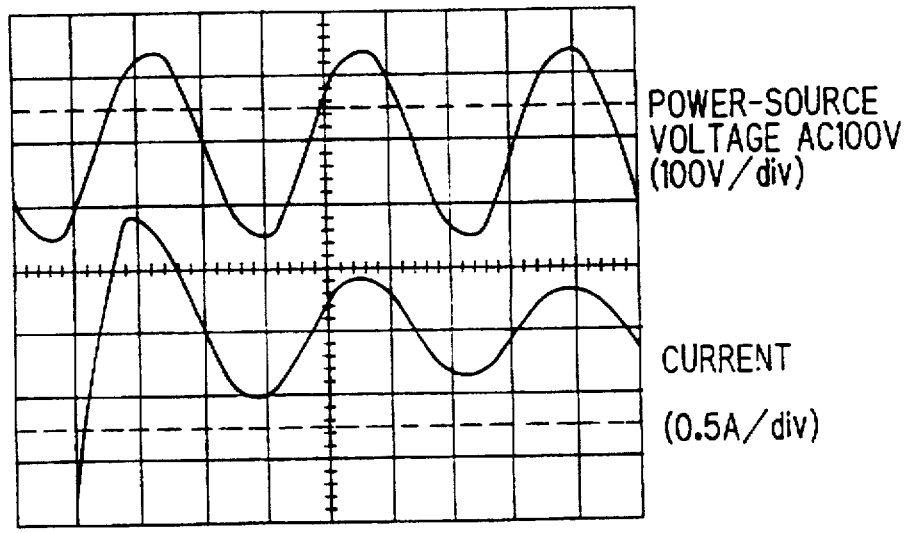
FIG. 5B is a chart showing an example of measurement where the rush-current is decreased.
Figure 6:
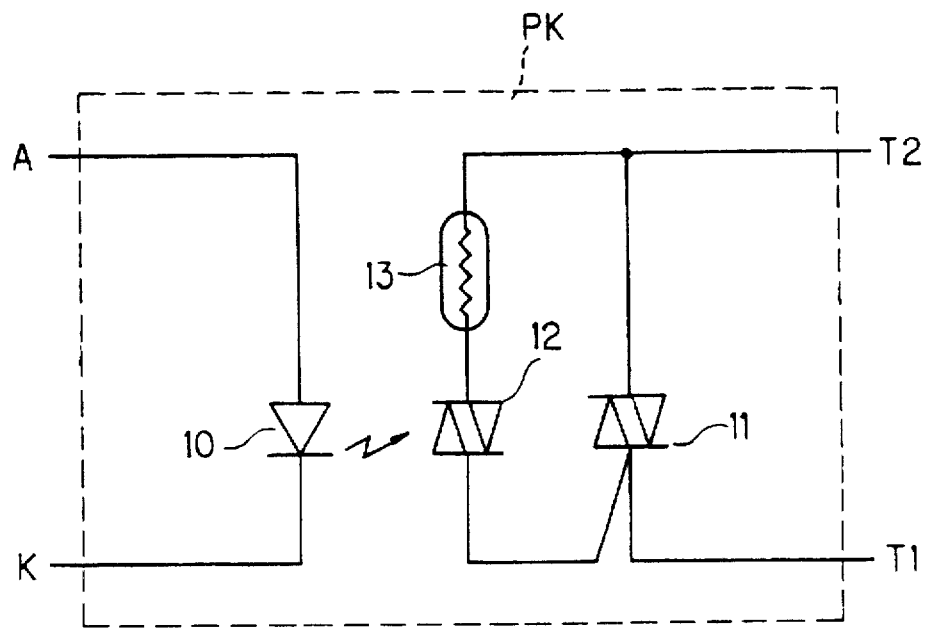
FIG. 6 is a configurational view showing a first embodiment of an optically coupled device in accordance with the invention.

FIG. 6 is a configurational view showing a first embodiment of an optically coupled device in accordance with the invention. This embodiment corresponds to the first feature of the invention. This embodiment includes: a light-emitting diode 10 as a light emitting element on the input side; a triac 11 as an element for driving and a phototriac 12 as a light-receiving element, both provided on the output side; and a thermistor 13 disposed between the triac 11 and the phototriac 12, as a resistance element having a positive or negative temperature-coefficient. All these elements are provided in a package PK, forming an SSR. The phototriac 12, as receiving light from the light-emitting diode 10, ignites the triac 11 for driving.

Figure 7:
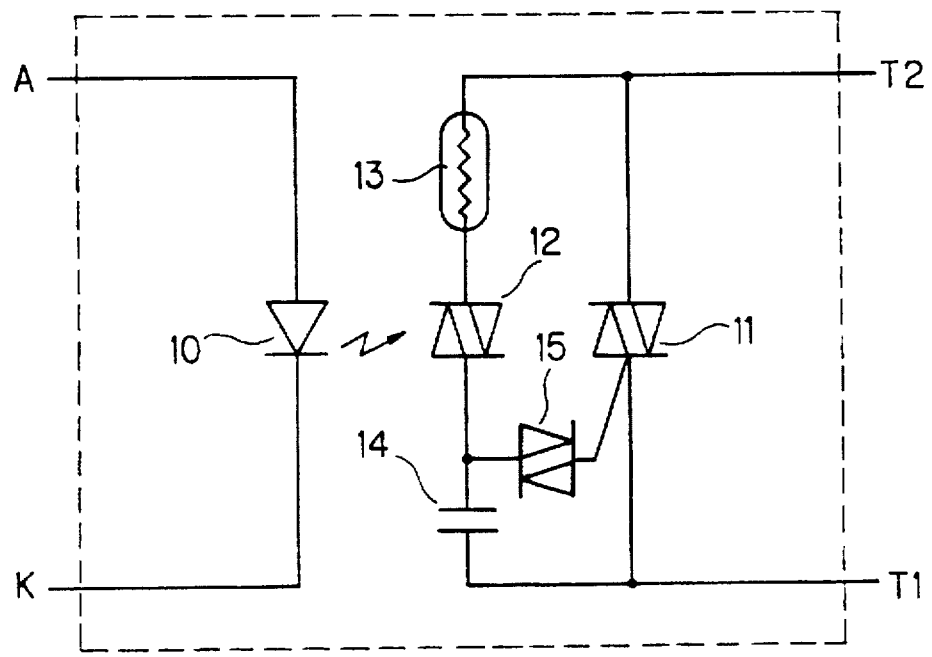
FIG. 7 is a configurational view showing a second embodiment of an optically coupled device in accordance with the invention.

FIG. 7 is a configurational view showing a second embodiment of an optically coupled device in accordance with the invention. This embodiment also corresponds to the first feature of the invention. The device of this embodiment has a light-emitting diode 10 on the input side. The output side of this circuit has a triac 11, a series of a thermistor 13, a phototriac 12 and a capacitor 14, connected in parallel with the triac 11 and further has a triggering element 15 connected at its one terminal to the junction of the phototriac 12 and the capacitor 14 and connected at the other terminal with the triac 11 so as to ignite the triac 11 for driving. All these elements are provided in a package PK, forming an SSR.

In the configuration of the first and second embodiments, if a thermistor 13 having a negative temperature-coefficient of resistance (to be referred to, a negative-characteristic thermistor) is used, it is possible to prevent a rush-current. That is, as apparent from the result of measurement above-shown in FIGS. 4A and 4B and FIGS. 5A and 5B, it is possible to reduce the rush-current by delaying the timing of the application to the load or the conduction-angle. Since a negative-characteristic thermistor is used, the resistance of the thermistor 13 at the time of turning the load on is high. This highness of the resistance requires a time for the power-source voltage to rise enough to cause the gate-trigger current $I_{GT}$ to turn the triac 11 on. That is, the application of the input signal to the load is delayed, whereby the conduction-angle when the SSR turns on is delayed.

Particularly, in the case of the second embodiment, the addition of the capacitor 14 in series with the thermistor 13, requires a further time for charging the capacitor 14 up to a triggering voltage of the triggering element 15 disposed at the following step. Therefore, when the thermistor 13 has a large resistance, the conduction-angle at which the SSR is turned on is delayed. When the SSR has been continuously operated for a long time, the temperature of the package rises due to the current through the SSR, whereby the resistance of the thermistor 13 is reduced. As a result, the conduction-angle at which the SSR is turned on decreases, and consequently, the SSR is stabilized into a stationary state.

Figure 8:
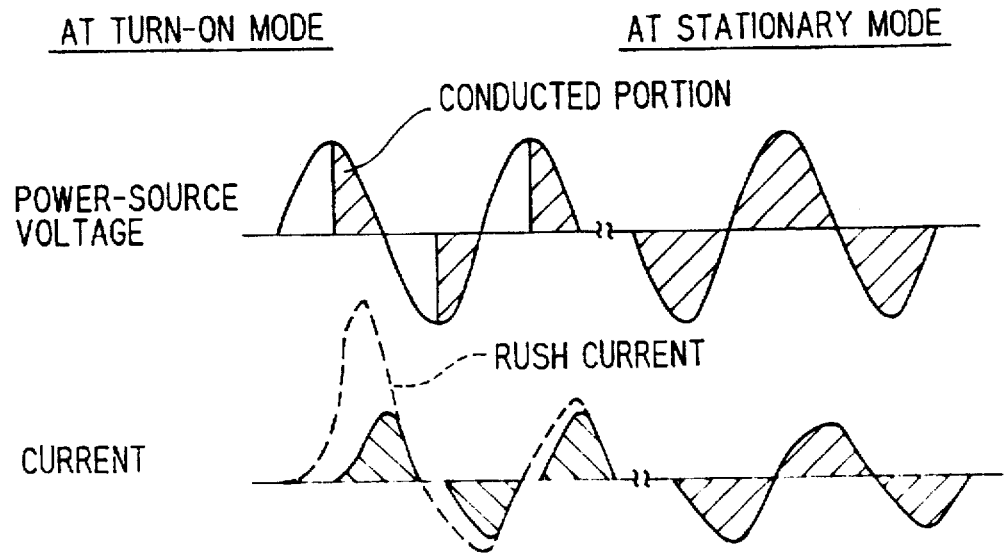
FIG. 8 is a chart showing an example of operating waveforms of voltage and current as to prevent against rush-current in a solid-state relay shown in the first and second embodiments.

FIG. 8 shows waveforms. If the conduction-angle at the time the input is activated is not delayed, a rush current as indicated by a broken line flows, whereas the rush current is reduced as shown by a solid line when the conduction-angle is delayed. Thereafter, since the temperature of the SSR package rises as the turn-on state continues, the resistance of the thermistor 13 lowers, whereby the delay of the conduction-angle is canceled so that the operated state of the SSR enters a stationary state.

In the configurations of the first and second embodiments, if a thermistor 13 having a positive temperature-coefficient of resistance (to be referred to as a positive-characteristic thermistor) is used, it is possible to prevent the SSR package PK from being excessively heated. That is, the positive-characteristic thermistor will have a greater resistance as it is heated excessively, hence the conduction-angle at which the SSR turns on is delayed. As a result, the effective current flowing through the SSR lowers, to thereby prevent excessive heating. Thereafter, when the abnormal state is canceled or the operation returns to the normal state, the temperature of the package reduces so that the operation of the SSR recovers its stationary state.

Figure 9:
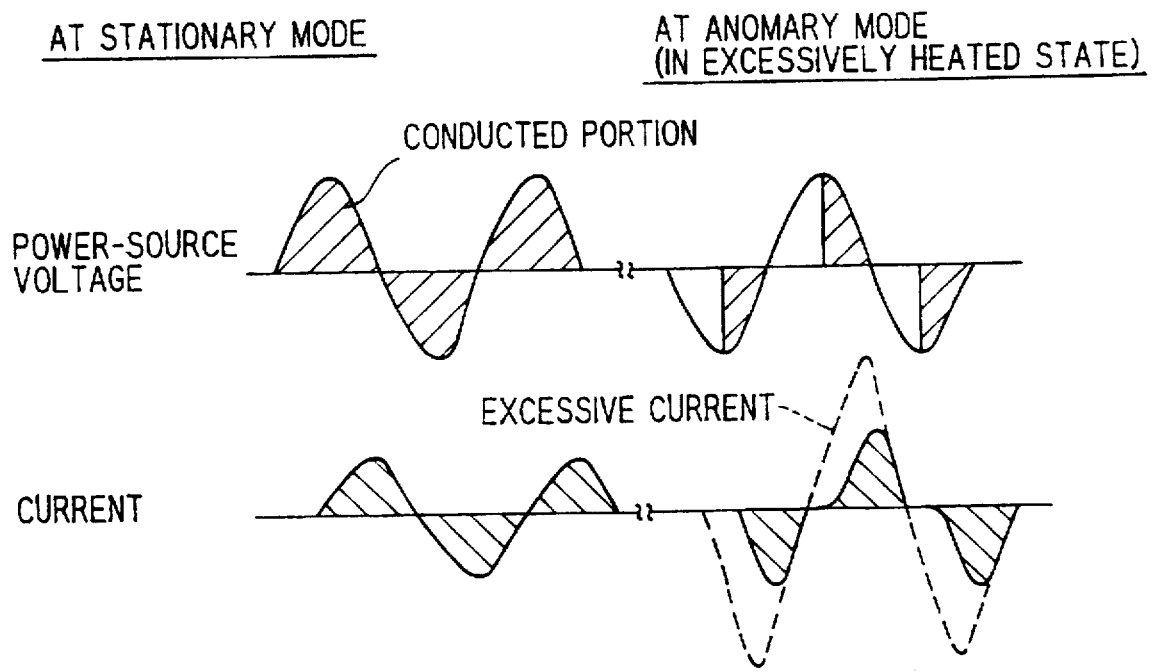
FIG. 9 is a chart showing an example of operating waveforms of voltage and current as to prevent against excessive heating in a solid-state relay shown in the first and second embodiments.

FIG. 9 shows waveforms. If for some reason an excessive current as indicated by a broken line flows deviating from the stationary state, the temperature of the SSR package rises. At that moment, the resistance of the thermistor increases, and this delays the conduction-angle, to lower the current, thus preventing the SSR from being excessively heated.

Figure 10A:
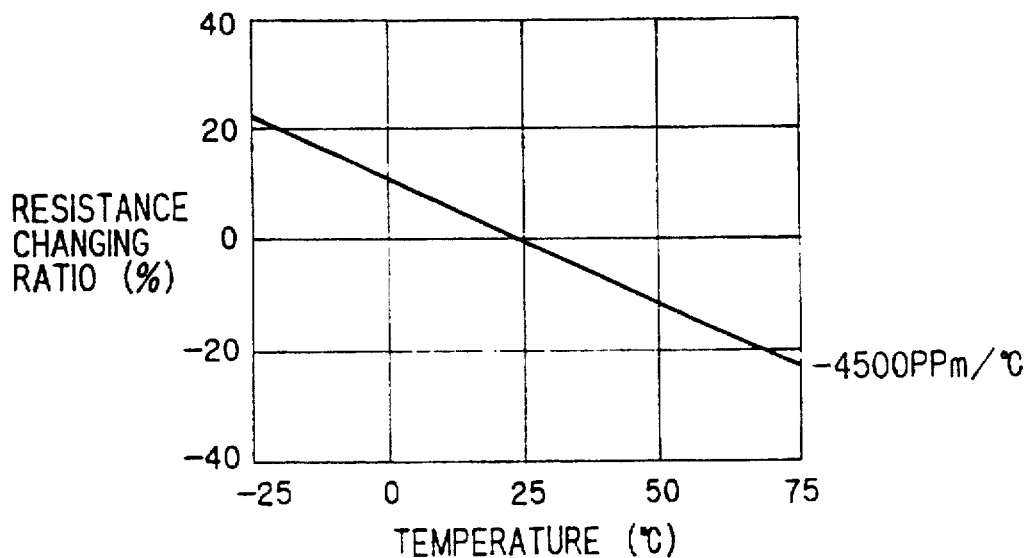
FIG. 10A is a chart showing resistance-temperature characteristics of a negative-characteristic thermistor.
Figure 10B:
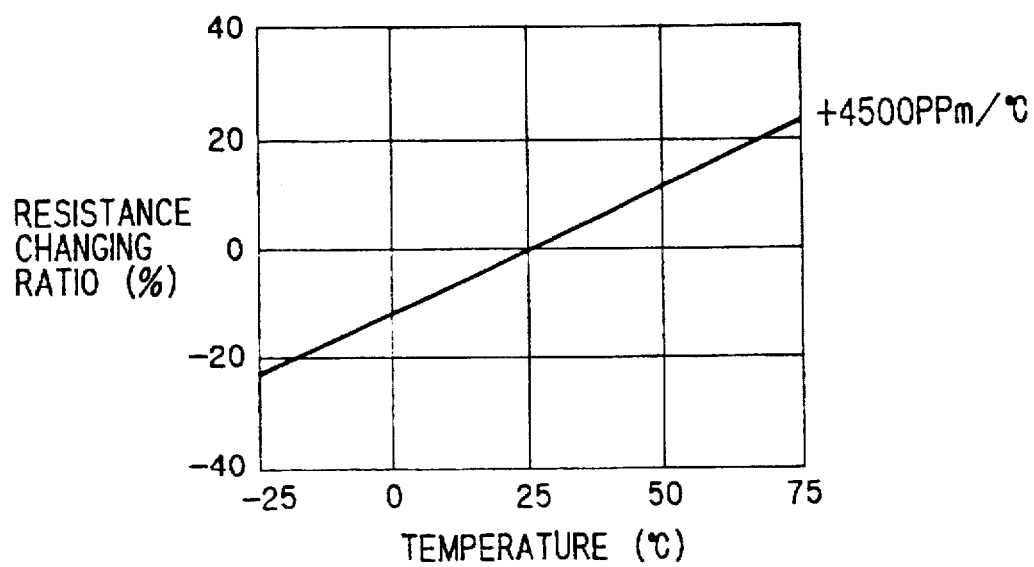
FIG. 10B is a chart showing resistance-temperature characteristics of a positive-characteristic thermistor.

FIGS. 10A and 10B are typical examples of resistance temperature characteristics of thermistors. A thermistor is a temperature sensor in which the resistance value linearly varies in a wide range of temperatures. FIG. 10A shows typical resistance-temperature characteristics of a negative-characteristic thermistor, and the changing ratio due to change in temperature is −4,500 ppm/° C. FIG. 10B shows typical resistance-temperature characteristics of a positive-characteristic thermistor, and the changing ratio due to change in temperature is +4,500 ppm/° C.

Figure 11:
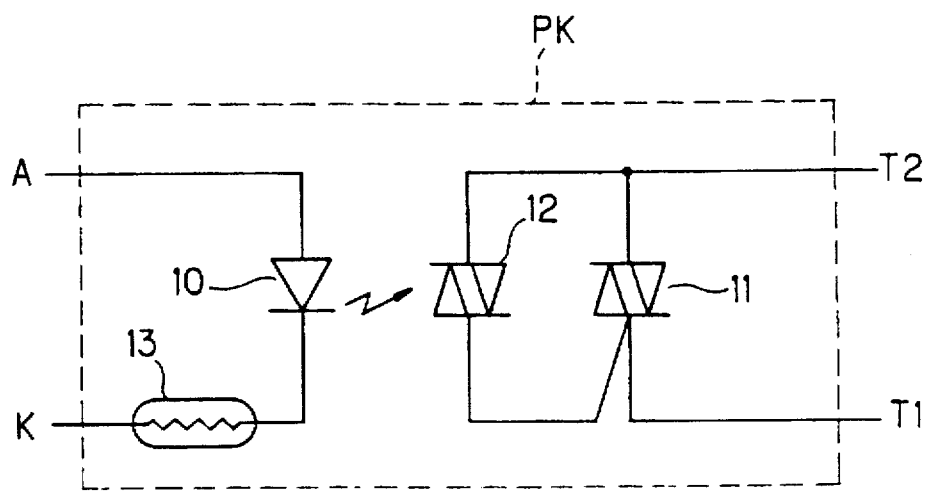
FIG. 11 is a configurational view showing a third embodiment of an optically coupled device in accordance with the invention.

FIG. 11 is a configurational view showing a third embodiment of an optically coupled device in accordance with the invention. This embodiment corresponds to the second feature of the invention. The device of this embodiment has a series of a light-emitting diode 10 and a thermistor 13 on its input side. The output side includes a triac 11 for driving and a phototriac 12 which receives light from the light-emitting diode 10 to ignite the triac 11 for driving. All these elements are provided in a package PK, forming an SSR.

This embodiment uses a positive-characteristic thermistor as the thermistor 13. Therefore, when the SSR is excessively heated, the resistance of the thermistor 13 increases. At that moment, if the current through the input side lowers to an SSR triggering current $I_{FT}$ or less, the triac 11 on the output side is turned off, to thereby prevent excessive rise of the package temperature. Thereafter, if the package temperature lowers and the abnormal state is canceled, the triac 11 on the output side is turned on, again, so that the operation recovers the normal state.

Figure 12:
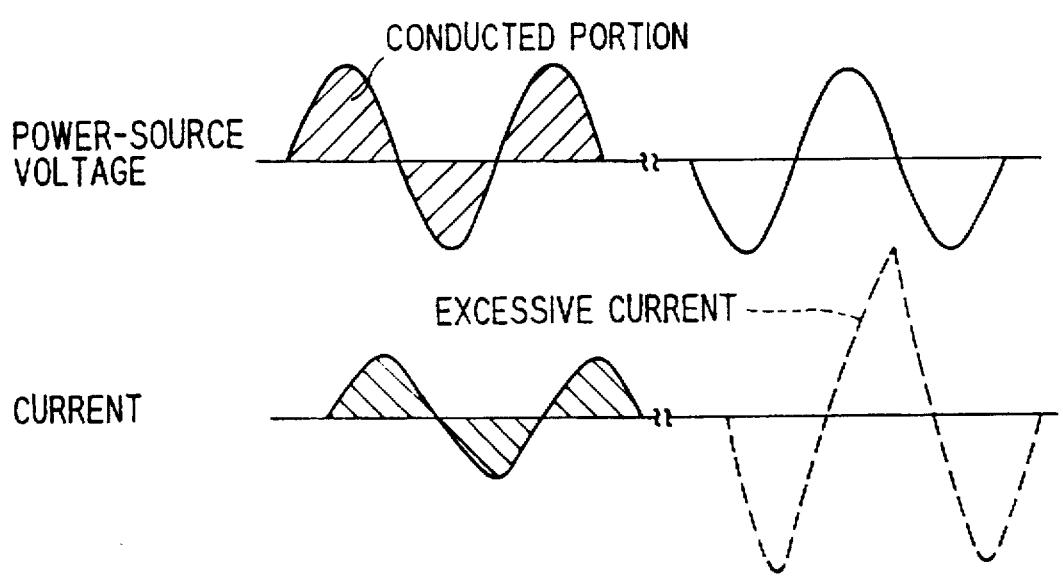
FIG. 12 is a chart showing an example of operating waveforms of voltage and current as to prevent against excessive heating in a solid-state relay shown in the third embodiment.

FIG. 12 shows operating waveforms. If for some reason an excessive current as indicated by a broken line flows deviating from the stationary state, the temperature of the SSR package PK rises. At that moment, the resistance of the thermistor 13 increases, and this lowers the current $I_F$ on the input side. When the current becomes a SSR triggering current or less, the triac 11 on the output side becomes off. That is, the output current is shut down so as to prevent excessive rise of the package temperature. Thereafter, if the package temperature lowers and the abnormal state is canceled, the triac 11 on the output side is turned on, again, so that the operation recovers the normal state.

Figure 13A:
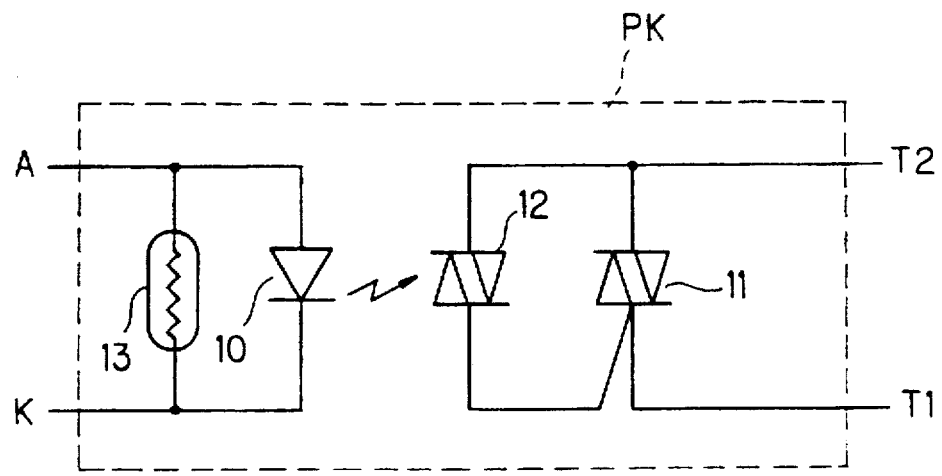
FIG. 13A is a configurational view showing a solid-state relay used in a fourth embodiment of an optically coupled device in accordance with the invention.
Figure 13B:
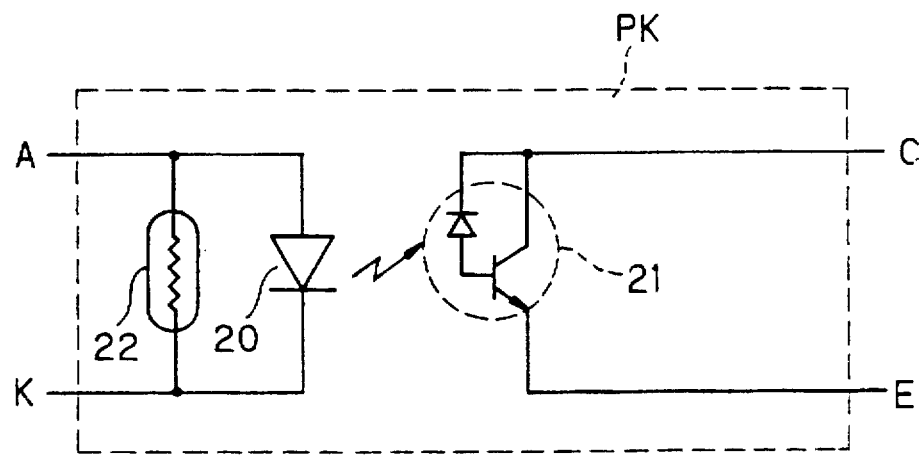
FIG. 13B is a configurational view showing a photocoupler used in a fourth embodiment of an optically coupled device in accordance with the invention.

FIGS. 13A and 13B are configurational views showing fourth embodiments of optically coupled devices in accordance with the invention. These embodiments correspond to the third feature of the invention. The embodiment shown in FIG. 13A has a light-emitting diode 10 and a negative-characteristic thermistor 13 connected in parallel with each other on its input side. The output side includes a triac 11 for driving and a phototriac 12 which receives light from the light-emitting diode 10 to ignite the triac 11 for driving. All these elements are provided in a package PK, forming an SSR.

The embodiment shown in FIG. 13B has a light-emitting diode 20 and a negative-characteristic thermistor 22 connected in parallel with each other on its input side. The output side includes a phototransistor 21 as another element for driving, which is turned on by the light from the light-emitting diode 20. All these elements are provided in a package PK, forming a photocoupler.

In either of the above arrangements, when the package PK is excessively heated, the negative-characteristic thermistor 13 (or 20) lowers its resistance and therefore flows an increased current. As a result, the current flowing through the light-emitting diode 10 (or 20) decreases. As this current becomes equal to the SSR triggering current $I_{FT}$ or less, the triac 12 is turned off. Alternatively, as this current becomes minute, the transistor 21 on the output side is turned off. Thus, in either of the configurations, it is possible to prevent anomaly operations from occurring during high-temperature states.

Figure 14:
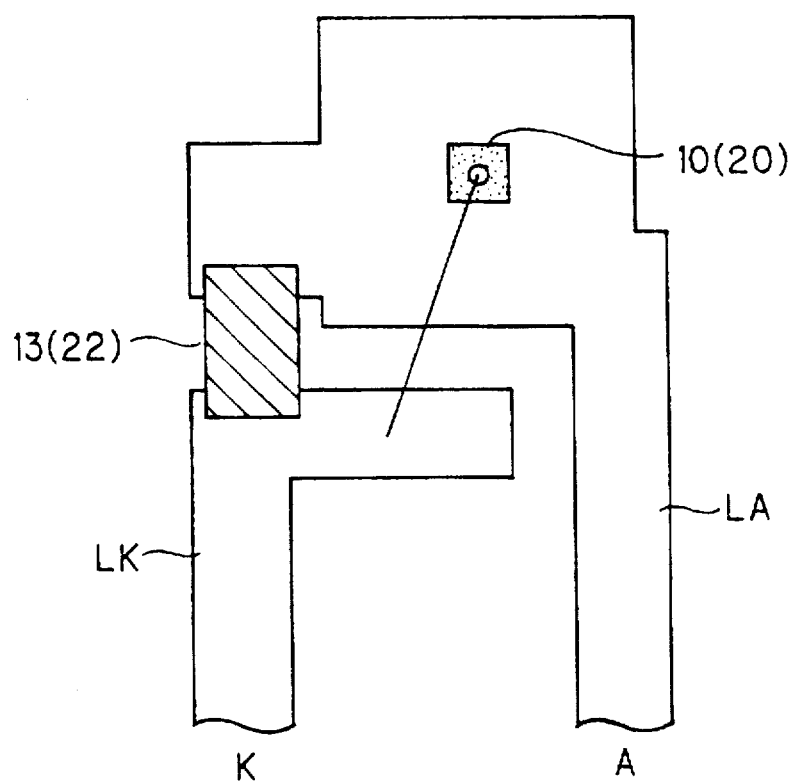
FIG. 14 is a structural view showing the fourth embodiment.

FIG. 14 is a structural view showing the input side of an SSR (or phototransistor) built in with a chip-like thermistor 13 (or 22). The thermistor 13 (22) together with the light-emitting diode 10 (20) can be mounted on lead frames LA and LK and fixed by the paste-die bonding process inside the package.

Figure 15A:
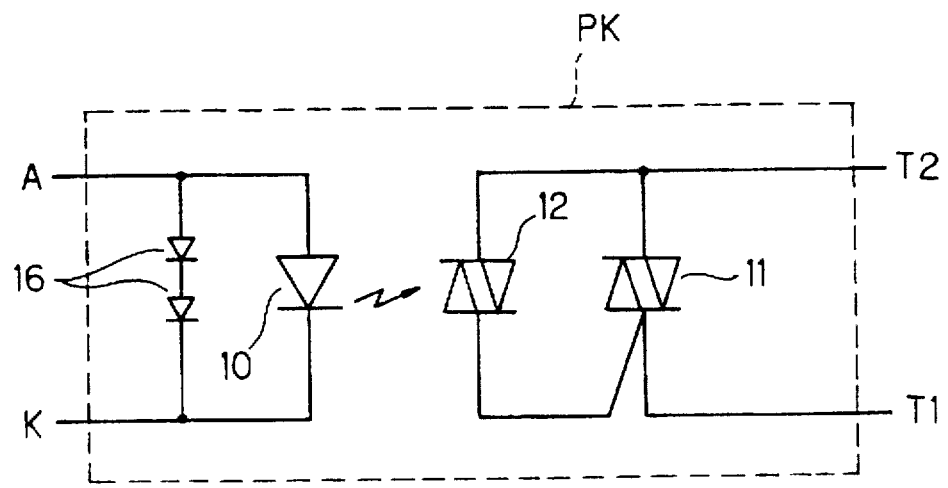
FIG. 15A is a configurational view showing a solid-state relay used in a fifth embodiment of an optically coupled device in accordance with the invention.
Figure 15B:
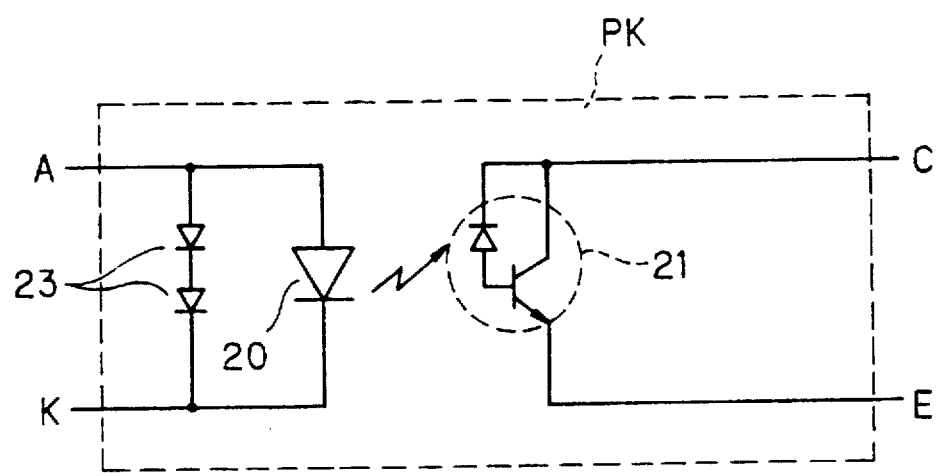
FIG. 15B is a configurational view showing a photocoupler used in a fifth embodiment of an optically coupled device in accordance with the invention.

FIGS. 15A and 15B are configurational views showing fifth embodiments of optically coupled devices in accordance with the invention. These embodiments correspond to the fourth feature of the invention. The embodiment shown in FIG. 15A has a light-emitting diode 10 and a series of two silicon diodes 16, connected in parallel with each other on its input side. The output side includes a triac 11 for driving and a phototriac 12 which receives light from the light-emitting diode 10 to ignite the triac 11 for driving. All these elements are provided in a package PK, forming an SSR.

The embodiment shown in FIG. 15B has a light-emitting diode 20 and a series of two silicon diodes 23, connected in parallel with each other on its input side. The output side includes a phototransistor 21 which is turned on by the light from the light-emitting diode 20. All these elements are provided in a package PK, forming a photocoupler.

In either of the above arrangements, at the normal use temperature, since the forward voltage across the light-emitting diode 10 (or 20) is smaller than the sum of forward voltages across the series of silicon diodes 16 (or 23), current flows through the light-emitting diode 10 (or 20), so that the light-emitting diode 10 (or 20) is made to emit light. Thereby, the triac 11 (or phototransistor 21) on the output side is turned on.

In contrast, since the sum of forward voltages across the series of the silicon diodes 16 (or 23) becomes smaller than the forward voltage across the light-emitting diode 10 (or 20) when the device is heated, current flows through the series of silicon diodes 16 (or 23) while no current flows through the light-emitting diode 10 (or 20). Accordingly, the light-emitting diode 10 (or 20) does not emit light, so that the output side can be turned off. That is, it is possible to prevent anomaly operations from occurring during high-temperature states.

Referring now to a specific example where a pair of silicon diodes each having a forward voltage of 0.7 V and a light-emitting diode having a forward voltage of 1.2 V are used. In this case, the sum of forward voltages of the two silicon diodes becomes 0.7×2=1.4 V. Accordingly, current flows through the light-emitting diode 10 (or 20) which has a lower forward voltage, whereby the light-emitting diode 10 (or 20) is made to emit light. Thus, the triac 11 or phototransistor 21 on the output side is turned on Suppose that the diode used here has a temperature coefficient of −2mV/° C. When the temperature of the device is 125° C., the forward voltage across the two silicon diodes can be calculated as follows:

$$\{0.7-0.002\times(125-25)\}\times2=1.0 \text{ V}.$$

The forward voltage across the light-emitting diode becomes as follows:

$$1.2-0.002\times(125-25)=1.0 \text{ V}.$$

That is, at this temperature, the two forward voltages become equal.

Accordingly, when the device temperature exceeds 125° C., the forward voltage across the silicon diodes becomes smaller and the current flowing through the light-emitting diode 10 (20) is limited, so that the triac 11 or phototransistor 21 is turned off.

Figure 16:
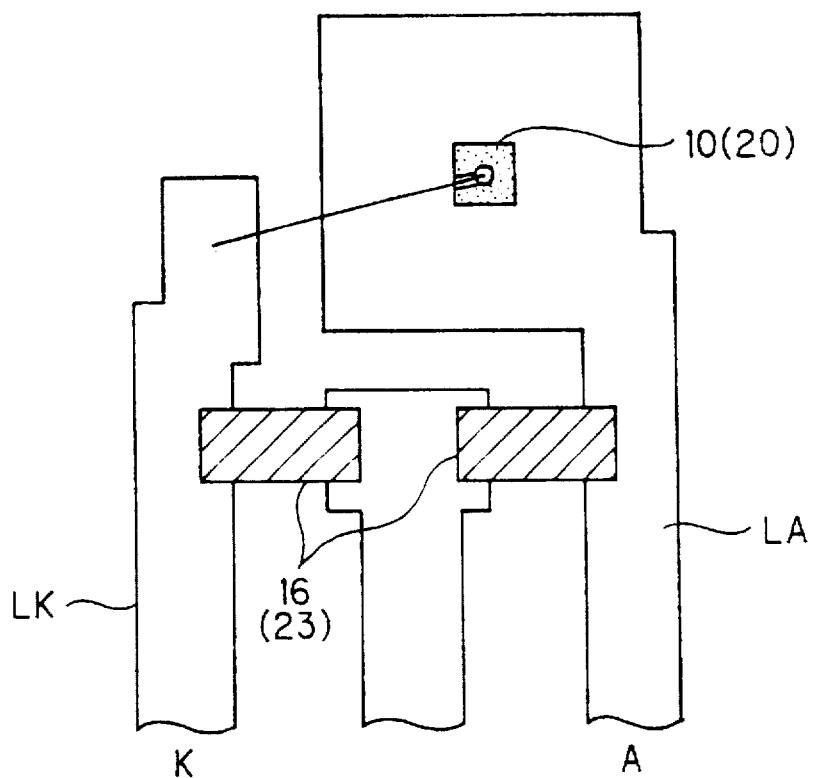
FIG. 16 is a structural view showing the fifth embodiment.

FIG. 16 is a structural view showing the input side of an SSR (or phototransistor) built in with two silicon diodes 16 (23). The silicon diode 16 (23) together with the light-emitting diode 10 (20) can be mounted on lead frames LA and LK and fixed by the paste-die bonding process inside the package.

Figure 17:
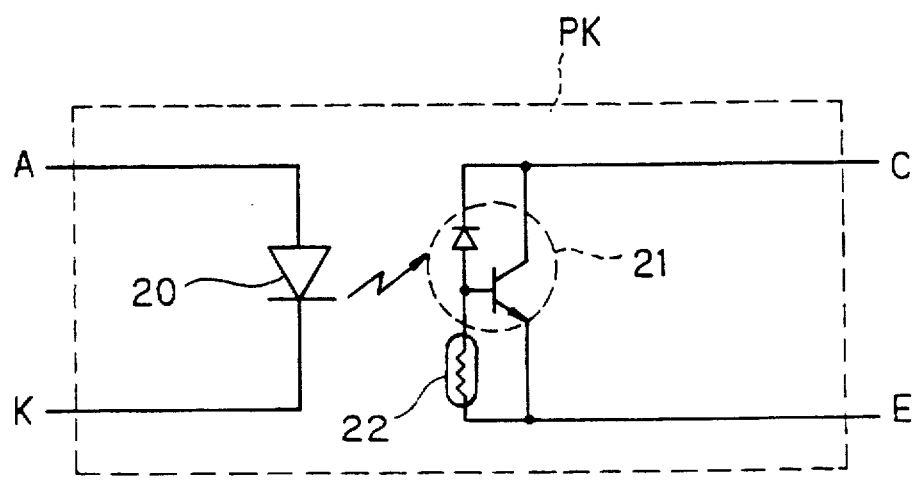
FIG. 17 is a configurational view showing a sixth embodiment of an optically coupled device in accordance with the invention.

FIG. 17 is a configurational view showing a sixth embodiment of an optically coupled device in accordance with the invention. This embodiment corresponds to the first feature of the invention. The device of the embodiment has a light-emitting diode 20 on its input side. The output side includes a phototransistor 21 which is turned on by the light from the light-emitting diode 20 and a negative-characteristic thermistor 22 connected between base-emitter of the phototransistor 21. All these elements are provided in a package PK, forming a photocoupler.

Figure 18:
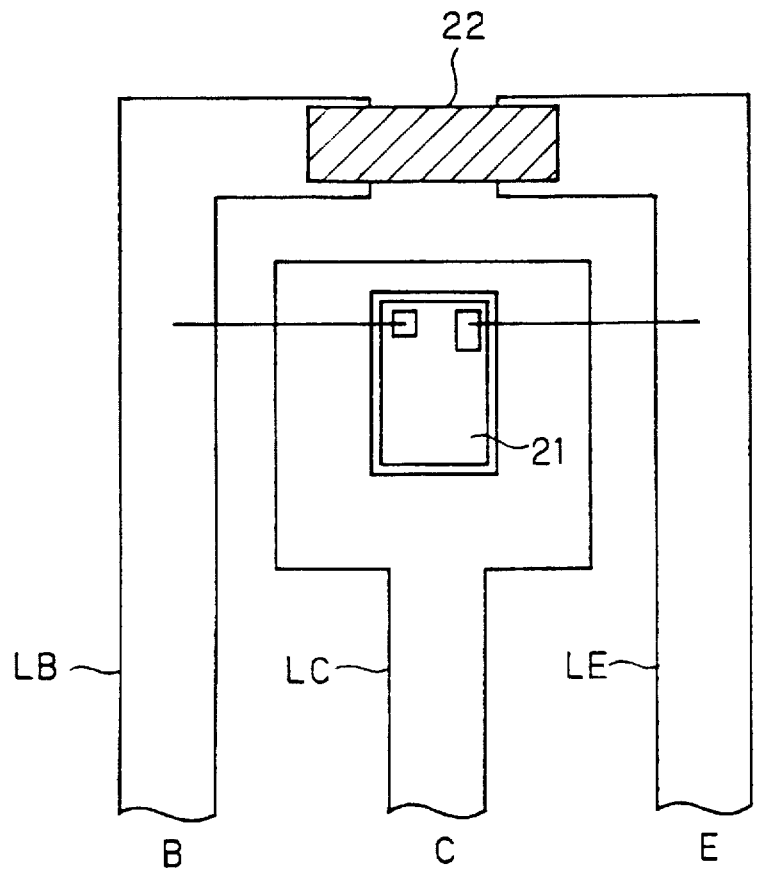
FIG. 18 is a structural view showing the sixth embodiment.

In this configuration, when the package PK is excessively heated, the resistance of the negative-characteristic thermistor 22 lowers such that the base current starts to flow out from the transistor 21. Accordingly, the transistor does no longer function as a transistor. That is, the transistor 21 can be turned off, whereby it is possible to prevent anomaly operations from occurring during high-temperature states. FIG. 18 is a structural view showing a photocoupler with the thermistor 22 built in on the output side. The thermistor 22 together with the phototransistor 21 can be mounted on lead frames LB, LC and LE, and fixed by the paste-die bonding process inside the package.

Figure 19:
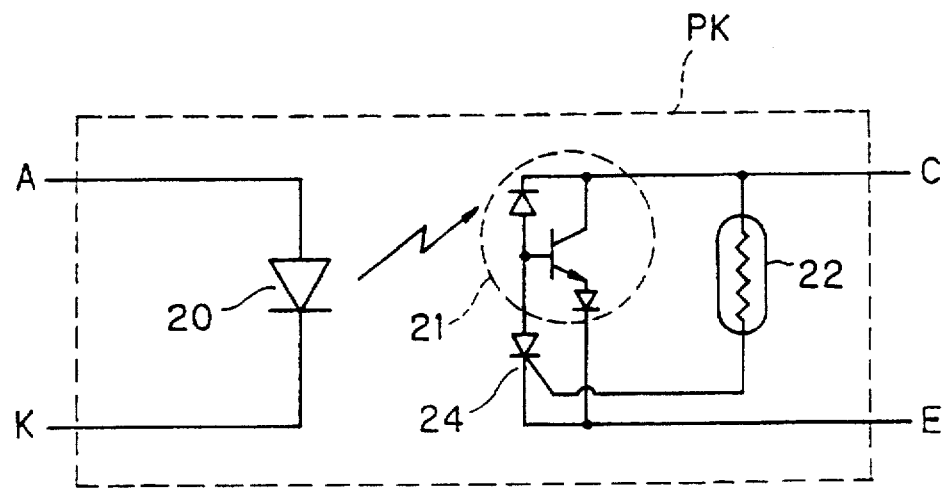
FIG. 19 is a configurational view showing a seventh embodiment of an optically coupled device in accordance with the invention.

FIG. 19 is a configurational view showing a seventh embodiment of an optically coupled device in accordance with the invention. The embodiment corresponds to the fifth feature of the invention. The device of this embodiment has a light-emitting diode 20 on its input side. The output side includes a phototransistor 21 which is turned on by the light from the light-emitting diode 20, a thyristor 24 connected between the base-emitter of the phototransistor 21 and a negative-characteristic thermistor 22 connected on the collector side of the phototransistor 21 for igniting the thyristor 24. All these elements are provided in a package PK, forming a photocoupler. Here, in order to supply a voltage capable of driving the thyristor 24, the phototransistor 21 having a diode built in on its base side is to be used.

In this configuration, when the package PK is excessively heated, the resistance of the negative-characteristic thermistor 22 lowers so as to turn the thyristor 24 on, whereby the base current is started to flow out from the transistor 21. Accordingly, the transistor does no longer function as a transistor. That is, the transistor 21 can be turned off, whereby it is possible to prevent anomaly operations from occurring during high-temperature states. Besides, since once it is activated, thyristors will not turn off until the power supply is deactivated, the thyristor will not return to its original state unless the power supply is reset. That is, the device also has a function of shutting down the excessive heating.

Figure 20:
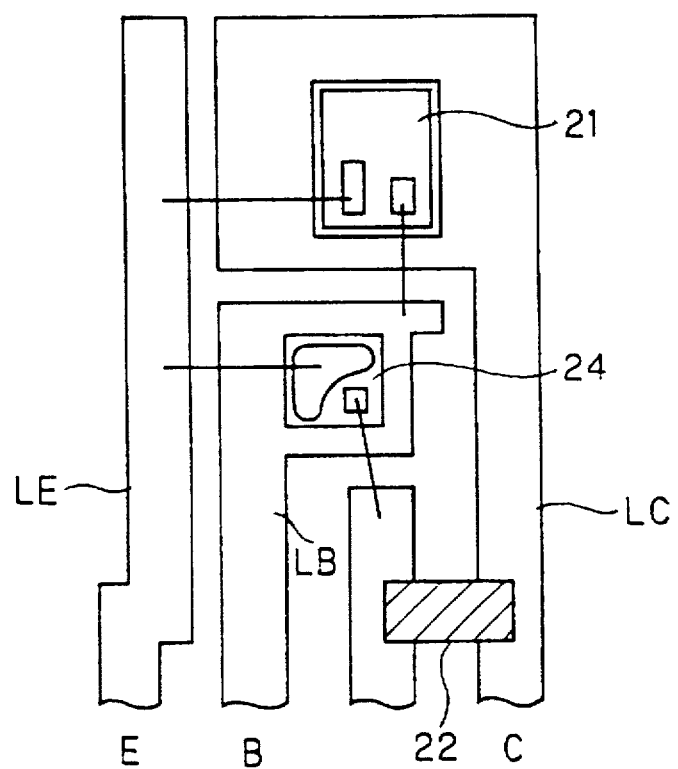
FIG. 20 is a structural view showing the seventh embodiment.

FIG. 20 is a structural view showing a photocoupler with the thermistor 22 and thyristor 24 built in on the output side. The thermistor 22 and thyristor 24 together with the phototransistor 21 can be mounted on lead frames LB, LC and LE, and fixed by the paste-die bonding process inside the package.

In the above embodiments, although description has been made on SSRs and photocouplers, the present invention, of course, can be applied to all the optically coupled devices other than those described above.

In accordance with the optically coupled device of the invention, it is possible to prevent a rush-current from occurring for driving some load and it is possible to prevent the device from excessively being heated if the package is excessively heated by an anomaly excessive current flowing through the device or when the temperature in the surroundings is markedly elevated. As a result, it is possible to reduce the number parts on the set board as well as save the space and reduce the cost and the like.

What is claimed is:

1. An optically coupled solid-state relay package comprising: input and output sides sealed in a package, said input side comprising: a light-emitting element, and, said output side consisting of:
- first and second output terminals;
- an element for driving, said element being connected between said first and second output terminals;
- a light-receiving element for receiving light from said light-emitting element to turn on said element for driving, said light-receiving element connected directly to said element for driving; and
- a resistance element having a positive or negative temperature-coefficient, and connected in series with said light-receiving element.

2. An optically coupled solid-state relay package comprising: input and output sides sealed in a package, said input side comprising: a light-emitting element, and, said output side comprising:
- first and second output terminals;
- an element for driving, said element being connected between said first and second output terminals;
- a light-receiving element for receiving light from said light-emitting element to turn on said element for driving;
- a resistance element having a positive or negative temperature-coefficient, and connected in series with said light-receiving element;
- a capacitor connected in series with said light-receiving element and with said resistance element between said first and second output terminals; and
- a triggering element connected between said element for driving and a node, the node being a point of connection between said capacitor and said light-receiving element, said triggering element being triggered at a predetermined voltage to ignite said element for driving,
- wherein said capacitor charges, in use, to the predetermined voltage thereby delaying the triggering of said triggering element.

3. The optically coupled solid-state relay package according to claim 2, wherein said element for driving is a triac.

4. An optically coupled solid-state relay package comprising: input and output sides sealed in a package, said input side comprising: a light-emitting element; and a plurality of series-connected diodes connected in parallel with said light-emitting element, and said output side comprising:
- first and second output terminals;
- an element for driving, said element being connected to said first and second output terminals; and
- a light-receiving element which receives light from said light-emitting element and ignite said element for driving, said light-receiving element connected directly to said element for driving.

5. The optically coupled solid-state relay package according to claim 4, wherein said element for driving is a triac, and said light-receiving element is a phototriac.

6. The optically coupled solid-state relay package according to claim 4, wherein said input side further comprises first and second input terminals, said first and second input terminals being connected directly to said light-emitting element and said plurality of series-connected diodes.

7. The optically coupled solid-state relay package according to claim 6, wherein said input side consists of said first and second input terminals, said light-emitting element, and said plurality of series-connected diodes.

8. The optically coupled solid-state relay package according to claim 4, wherein said input and output sides are sealed in a package, and further include respective input and output terminals.

9. An optically coupled device comprising: input and output sides, said input side comprising: a light-emitting element, and, said output side comprising:
- first and second output terminals;
- a light-receiving element for receiving light from said light-emitting element;
- a thyristor connected in series with said light-receiving element between said first and second output terminals; and
- a resistance element connected between said first output terminal and a gate of said thyristor, said resistance element having a negative temperature-coefficient and being for turning on said thyristor.

10. The optically coupled device according to claim 9, wherein said light-receiving element includes a base and an emitter, said thyristor being connected between the base and the emitter.

11. The optically coupled device according to claim 10, wherein said thyristor is connected to the base and to said second output terminal.

12. The optically coupled device according to claim 9, further comprising a sealed package for housing said input and output sides.

* * * * *